(12) United States Patent
Menghani

(10) Patent No.: US 11,599,518 B2
(45) Date of Patent: Mar. 7, 2023

(54) EFFICIENT EMBEDDING TABLE STORAGE AND LOOKUP

(71) Applicant: Google LLC, Mountain View, CA (US)

(72) Inventor: Gaurav Menghani, Santa Clara, CA (US)

(73) Assignee: GOOGLE LLC, Mountain View, CA (US)

( * ) Notice: Subject to any disclaimer, the term of this patent is extended or adjusted under 35 U.S.C. 154(b) by 145 days.

(21) Appl. No.: 17/147,844

(22) Filed: Jan. 13, 2021

(65) Prior Publication Data
US 2022/0222235 A1    Jul. 14, 2022

(51) Int. Cl.
*G06F 16/00* (2019.01)
*G06F 16/22* (2019.01)
(Continued)

(52) U.S. Cl.
CPC ........ *G06F 16/2282* (2019.01); *G06F 16/215* (2019.01); *G06F 16/2255* (2019.01);
(Continued)

(58) Field of Classification Search
CPC ............... G06F 16/1744; G06F 16/215; G06F 16/2255; G06F 16/2282; G06F 16/3347;
(Continued)

(56) References Cited

U.S. PATENT DOCUMENTS

| 10,872,601 | B1 * | 12/2020 | Acharya | ................ G06F 40/295 |
| 2018/0349282 | A1 * | 12/2018 | Brahm | ..................... G06F 17/10 |

(Continued)

FOREIGN PATENT DOCUMENTS

WO    WO-2021064433 A1 *    4/2021    ......... G06F 12/0207

OTHER PUBLICATIONS

International Search Report and Written Opinion for Application No. PCT/US2021/064355, dated Mar. 31, 2022, 15 pages.
(Continued)

*Primary Examiner* — Diedra McQuitery
(74) *Attorney, Agent, or Firm* — Dority & Manning, P.A.

(57) ABSTRACT

The present disclosure provides systems, methods, and computer program products for providing efficient embedding table storage and lookup in machine-learning models. A computer-implemented method may include obtaining an embedding table comprising a plurality of embeddings respectively associated with a corresponding index of the embedding table, compressing each particular embedding of the embedding table individually allowing each respective embedding of the embedding table to be decompressed independent of any other embedding in the embedding table, packing the embedding table comprising individually compressed embeddings with a machine-learning model, receiving an input to use for locating an embedding in the embedding table, determining a lookup value based on the input to search indexes of the embedding table, locating the embedding based on searching the indexes of the embedding table for the determined lookup value, and decompressing the located embedding independent of any other embedding in the embedding table.

7 Claims, 9 Drawing Sheets

(51) Int. Cl.
*G06F 16/33* (2019.01)
*G06F 16/215* (2019.01)
*G06F 30/27* (2020.01)
*G06N 3/04* (2023.01)
*G06N 3/08* (2023.01)
*G06F 16/174* (2019.01)
*H03M 7/30* (2006.01)

(52) U.S. Cl.
CPC ......... *G06F 16/3347* (2019.01); *G06F 30/27* (2020.01); *G06N 3/04* (2013.01); *G06N 3/08* (2013.01); *G06F 16/1744* (2019.01); *G06F 2211/007* (2013.01); *G06F 2211/1014* (2013.01); *H03M 7/30* (2013.01)

(58) Field of Classification Search
CPC ............... G06F 16/35; G06F 2211/007; G06F 2211/1014; G06F 30/27; G06F 40/284; G06F 40/30; G06N 3/04; G06N 3/0454; G06N 3/08; G06N 3/084; H03M 7/30
See application file for complete search history.

(56) References Cited

U.S. PATENT DOCUMENTS

2019/0384814 A1* 12/2019 McGoldrick ......... G06F 40/216
2021/0240925 A1* 8/2021 Kwon ................. G06F 12/0813
2021/0365772 A1* 11/2021 Zhang ..................... G06N 3/04
2022/0075843 A1* 3/2022 Kumar ................... G06F 17/16

OTHER PUBLICATIONS

Kim et al., "Implementing efficient data compression an encryption in a persistent key-value store for HPC", International Journal of High Performance Computing Applications, vol. 33, No. 6, 2019, pp. 1098-1112.

Larson et al., "SQL Server Column Store Indexes", SIGMOD '11: Proceedings of the 2011 ACM SIGMOD International Conference on Management of data, Jun. 2011, pp. 1177-1184.

Yang et al., "Mixed-Precision Embedding Using a Cache", arXiv:2010.11305, https://doi.org/10.48550/arXiv.2010.11305, 14 pages.

* cited by examiner

EFFICIENT EMBEDDING TABLE STORAGE AND LOOKUP

FIELD

The present disclosure generally relates to machine learning. More particularly, the present disclosure relates to providing efficient embedding table storage and lookup in machine-learning models.

BACKGROUND

Embeddings generally refer to a way of projecting objects from a high-dimensional space onto a lower-dimensional space. For example, image, video, text, and speech data may be represented in an object space, such as a two-dimensional or three-dimensional coordinate system. Each data point in the object space may represent an object with the proximity between each object indicating a degree of similarity or relatedness. In one example, synonyms generally may be positioned more closely together in the object space in comparison to unassociated or dissimilar words.

Machine learning models may utilize embedding tables to store and reference embeddings. Embedding tables become part of a machine learning model and embedding tables may be quite large in size. For example, embedding tables for dictionary words from one or more languages may have hundreds of thousands or even millions of entries. In particular, embedding tables can significantly increase the amount of memory and processing power required to run machine-learning models. As a result, it becomes increasingly difficult to serve large models at scale. Further, many types of computing devices, including mobile devices, generally lack enough computing resources to run large models.

SUMMARY

Aspects and advantages of embodiments of the present disclosure will be set forth in part in the following description, or can be learned from the description, or can be learned through practice of the embodiments.

One example aspect of the present disclosure is directed to a system that provides efficient embedding table storage and lookup for machine-learning models, for example, by receiving an embedding table comprising a plurality of embeddings respectively associated with a corresponding index of the embedding table, compressing each particular embedding of the embedding table individually allowing each respective embedding of the embedding table to be decompressed independent of any other embedding in the embedding table, packing the embedding table comprising individually compressed embeddings with a machine-learning model, receiving an input to use for locating an embedding in the embedding table, determining a lookup value based on the input to search indexes of the embedding table, locating the embedding based on searching the indexes of the embedding table for the determined lookup value, decompressing the located embedding independent of any other embedding in the embedding table, and processing the decompressed embedding in association with running the machine-learning model.

Other aspects of the present disclosure are directed to various apparatuses, non-transitory computer-readable media, computer-implemented methods, user interfaces, and electronic devices. These and other features, aspects, and advantages of various embodiments of the present disclosure will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

Figure 1A:
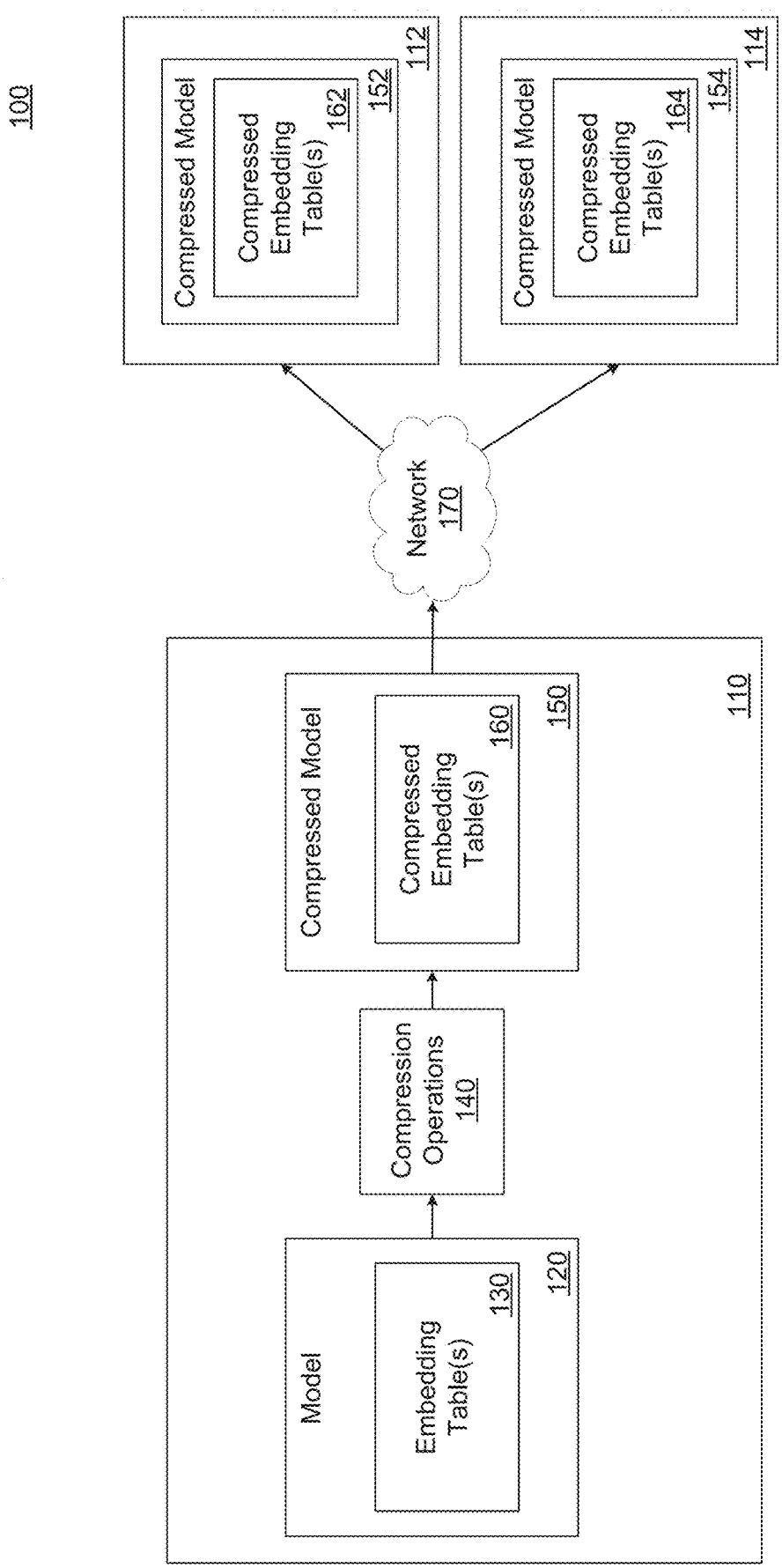
FIG. 1A depicts a block diagram of an example system for providing efficient embedding table storage and lookup in machine-learning models according to example embodiments of the present disclosure.

Reference numerals that are repeated across plural figures are intended to identify the same features in various implementations.

DETAILED DESCRIPTION

Overview

Generally, the present disclosure is directed to providing efficient embedding table storage and lookup for machine-learning models. Examples described in the present disclosure enable the efficient storage and retrieval of embedding tables used with machine-learning models. Such example implementations provide advantages and improvements over existing approaches including, but not limited to, improved scalability, increased performance, and reduced computational requirements as compared to existing approaches.

Embedding tables are used in machine learning as a component of machine learning models. For example, embedding tables may be used in machine-learning models related to natural language processing (NLP) or other various implementations. Embedding tables assist in constructing abstract relationships between objects (e.g., words, phrases, images, songs, movies, etc.) and include embeddings that project such objects from a high-dimensional space onto a lower-dimensional space. For example, words, phrases, images, songs, movies, or any other type of object may be represented in an object space, such as a two-dimensional or three-dimensional coordinate system, where proximity between the objects represents a level of relatedness between the objects. In various examples, an object space may be any number of dimensions and are not limited solely to two or three dimensions. For example, an object space may have more than three dimensions, more than ten dimensions, more than one hundred dimensions or generally any number of dimensions. In addition, embedding tables can be trained, for example, within a machine-learning model, and embedding tables may be reused across different machine-learning models.

Embedding tables are stored as part of a machine-learning model and can become large in size. For example, a machine-learning model may utilize one or more embedding tables, which may include thousands, millions, or any number of entries. In fact, embedding tables may represent a significant or overwhelming proportion of the size of a machine-learning model. Further, conventional machine learning platforms and operations require computing devices to load full-size embedding tables of machine-learning models into memory at one time. As such, it becomes increasingly complex and expensive to serve large machine-learning models at scale because large amounts of memory and computational resources are required. Further, such memory and processing requirements often exceed limited capabilities of many types of mobile computing devices, which generally lack the computer hardware required to handle large models.

To address and resolve these issues, the present disclosure provides examples for efficient embedding table storage and lookup for machine-learning models. In some examples of the present disclosure, a computing system performs operations that generate or otherwise obtain an embedding table comprising a plurality of embeddings respectively associated with a corresponding index of the embedding table, compresses each particular embedding of the embedding table individually allowing each respective embedding of the embedding table to be decompressed independent of any other embedding in the embedding table, packs the embedding table comprising individually compressed embeddings with a machine-learning model, obtains an input to use for locating an embedding in the embedding table, determines a lookup value based on the input to search indexes of the embedding table, locates the embedding based on searching the indexes of the embedding table for the determined lookup value, decompresses the located embedding independent of any other embedding in the embedding table, and processes the decompressed embedding as part of running a machine-learning model associated with the embedding table.

The systems, methods, and computer program products described herein provide a number of technical effects and benefits. For example, examples of the present disclosure describe specialized embedding table data structures and associated operations that allow computing systems to access particular entries of embedding tables without loading an entire embedding table into memory when running machine-learning models. As such, the examples described in the present disclosure provide efficient ways of storing and retrieving data in embedding tables and associated machine-learning models, which utilize fewer computing resources (e.g., less processing power, less memory usage, less power consumption, less storage space, etc.), as compared to conventional operations.

The systems, methods and computer program products described in examples of the present disclosure are particularly well suited to embedding tables used in machine-learning models associated with natural language processing (NLP). Nevertheless, the methodology described herein can be applied to a variety of technical applications using embedding tables including, but not limited to, image recognition, image classification, image captioning, scene segmentation, object detection, action recognition, semantic segmentation, speech detection, speech translation, recognizing identity of a speaker, language prediction, text classification facial recognition, etc. Input data may include, for example, one or more of any type of image, video, text, speech, audio, sensor, and/or any other type or types of data. Further, examples of the present disclosure are not limited to use with embedding tables of machine-learning models and generally may be used where embedding tables or any other similar types of data structures are utilized.

With reference now to the Figures, example embodiments of the present disclosure will be discussed in further detail.

Example System for Providing Efficient Embedding Table Storage and Lookup

FIG. 1A depicts a block diagram of an example system for providing efficient embedding table storage and lookup in machine-learning models according to example embodiments of the present disclosure.

System 100 includes a computing device 110, a model 120 that utilizes one or more embedding table(s) 130, compression operations 140, and a compressed model 150 comprising one or more compressed embedding table(s) 160. System 100 also includes at least one network 170, computing device 112 comprising a compressed model 152 and compressed embedding tables 162, and computing device 114 comprising a compressed model 154 and compressed embedding tables 164.

Computing device 110 generally may be any type of computer device, such as a personal computer (PC), laptop, mobile phone, tablet computer, server computer, wearable computing device, or any other type of computing device. Computing device 110 may run an operating system (OS) that manages hardware and software of the respective device. Computing device 110 also may run one or more machine learning platforms (not shown) that provide computer software, software development tools, software libraries, and/or application programming interfaces (APIs) to develop, train, test, execute, and/or deploy computer software applications and associated data structures (e.g., machine-learning models) configured to perform operations associated with machine-learning and artificial intelligence. Examples of machine learning platforms may include, and are not limited to, the TensorFlow® and PyTorch® machine learning platforms. Computing device 110 generally may include one or more machine-learning models, such as model 120.

Model 120 generally refers to a specialized data structure that is configured and trained to perform one or more types of machine-learning tasks, such as prediction, detection, classification, recognition, etc. In an example, model 120 may be or may otherwise include various machine-learned models such as neural networks (e.g., deep neural networks) or other types of machine-learned models, including non-linear models and/or linear models. Neural networks can include feed-forward neural networks, recurrent neural networks (e.g., long short-term memory recurrent neural networks), convolutional neural networks or other forms of neural networks. Some example machine-learned models can leverage an attention mechanism such as self-attention. For example, some example machine-learned models can include multi-headed self-attention models (e.g., transformer models). Further machine-learned models (e.g., model 120) may include and utilize one or more embedding tables 130 that are used to assist in performing one or more types of machine-learning tasks.

Embedding tables 130 generally refer to a table or any other type of data structure used to index and store a collection of embeddings associated with a group of objects. An index generally refers to a unique value or key that may be used to lookup an embedding associated with a particular input value. In some examples, each embedding generally may represent or otherwise include a collection of one or more numerical values, such as a vector of numerical values, that project a particular object onto an object space (e.g., a two-dimensional, three-dimensional, or any other type of object space with any number of dimensions).

Embedding tables 130 generally may be used to construct and store complex relationships between various types of input, such as words, phrases, images, video, text, and speech data. In one example, an embedding table 130 may be used to store embeddings. For example, each word in a collection of words may be associated with a learned representation defined as numerical values in a vector determined based on word meaning. In another example, each word in a collection of words may be associated with a learned representation stored as a set of numerical values for each word based on word origin or language for each respective word. For example, word embeddings generally may be associated with natural language processing where words, phrases, and or any other feature of word content are mapped to vectors of real numbers utilized by machine-learning models.

Generally, embeddings may be determined for and used with any type of input data. As such, embeddings are not limited to words and text. Also, embedding tables 130 and associated embeddings can be trained, for example, separate from and/or as part of a machine-learning model. Further, embedding tables may be reused across different machine-learning models.

Embedding tables 130 based on a large collection of inputs can become very large in size. For example, an embedding table 130 based on words in a vocabulary, such as from a dictionary in one language or a collection of dictionaries each in different languages (e.g., 2, 10, 50, 100, or more languages), may account for a significant amount or even almost an entire amount of the size of a machine-learning model. For example, some embedding tables 130 may include millions or even billions of entries. As such, models 120 can grow in size to hundreds of megabytes and even gigabytes. Further, such large models 120 become increasingly difficult to scale and generally cannot be run on computing devices with limited computing resources. For example, many types of mobile devices, including wearable devices, edge devices, medical devices, and/or other types of portable computing devices generally lack or otherwise need to conserve computer memory and computer hardware resources required to run a model 120 that utilizes large embedding tables 130

Generally, models 120 and embedding tables 130 can be compressed. For example, a machine learning platform generally may provide some sort of platform-supported compression operations that support compressing an entire model 120 and each of the associated embedding tables 130 in their entirety. However, to run such models, computer systems must include and dedicate enough memory and processing power to run the entire model 120 together with associated full-sized decompressed embedding tables 130. As such, standard compression does not address reducing computational requirements to aid in the scaling of models 120 with large embedding tables 130 or running models 120 with large embedding tables 130 on devices with limited, minimal, or unavailable hardware resources.

In an example, one or more compression operations 140 may be performed to provide efficient embedding table 130 storage and lookup for machine-learning models. For example, one or more compression operations 140 may be used to compress individual rows in embedding tables 130 to allow computing devices to run models 120 without loading and processing entire decompressed embedding tables 130 in memory. In some examples, a model 120 also may be compressed. For example, aspects of a model 120 may be pruned, optimized, and/or compressed to generate a compressed model 150. In some examples, a model 120 and/or compressed model 150 generally may be represented, stored, analyzed, updated, and/or run as a graph or graph data structure.

Compression operations 140 may be performed independent of any underlying machine-learning platform and/or using a compression scheme unavailable from the underlying machine-learning platform. For example, compression operations 140 generally may be unsupported or otherwise not provided by an underlying machine-learning platform. In addition, the associated lookup and decompression operations corresponding to the compression operations 140 may be comprised within and performed by a model 120 itself without using or referencing an underlying machine-learning platform. As such, the associated lookup and decompression operations for accessing individually compressed rows of associated embedding tables 130 may be self-contained and used as part of running the model 120, independent from any underlying machine-learning platform. Thus, models 120 having large embedding tables 130 may be run using significantly reduced memory and computational resources, improving overall scalability and allowing a model 120 with large embedding tables 130 to run on devices with limited hardware capabilities.

In an example, one or more compression operations 140 are used to compress a model 120 and/or associated embedding tables 130. For example, a computing system may receive, generate, or otherwise obtain one or more embedding tables 130 associated with a machine-learning model 120. The computing system then uses the compression operations 140 to individually compress each particular embedding of the one or more embedding tables 130 to allow each respective embedding of a particular embedding table 130 to be decompressed independent of any other embedding in the particular embedding table 130. The computing system then may use the compression operations 140 to pack the one or more compressed embedding tables 160 each having individually compressed embeddings with an associated machine learning model. In some examples, compressed embedding tables 160 are packed with a compressed model 150. For example, one or more aspects of a model 120 may be pruned, optimized, and/or compressed using compression operations 140 to generate a compressed model 150. In some examples, compressed embedding tables 160 also may be packed with a model 120 that itself has not been compressed.

In an example, a compressed model 150 and associated compressed embedding tables 160 are packed together and provided to one or more computer systems to be run. For example, compressed model 150 and compressed embedding tables 160 may be stored, deployed, transmitted, or otherwise transferred to one or more other locations that allow one or more computer systems to run the compressed model 150 with the compressed embedding tables 160 and utilize the associated operations accordingly. In some examples, compressed model 150 and the compressed embedding tables 160 may be stored locally to be run by the same computing device (e.g., computing device 110) that runs compression operations 140. In some examples, compressed model 150 and the compressed embedding tables 160 are transferred via a network 170 to one or more other computing devices 112, 114.

Network 170 may be a public network (e.g., the internet), a private network (e.g., local area network (LAN) or wide area network (WAN)), or any combination thereof. In an example, network 170 may include the internet, one or more intranets, wired networks, wireless networks, and/or other appropriate types of communication networks. Network 170 also may comprise a wireless telecommunications network (e.g., cellular network) adapted to communicate with other communication networks, such as the internet. In addition, network 170 may include one or more short-range wireless networks.

Computing device 112 and computing device 114 each respectively may be any type of computer device, such as a personal computer (PC), laptop, mobile phone, tablet computer, server computer, wearable computing device, or any other type of computing device. Computing device 112 and computing device 114 also each may run an operating system (OS) and each may run one or more machine learning platforms of the same type or different types.

Computing device 112 includes a compressed model 152 with associated compressed embedding tables 162. Computing device 114 includes a compressed model 154 with associated compressed embedding tables 164. Compressed model 152 and compressed model 154 may be the same or different. Compressed embedding tables 162 and compressed embedding tables 164 also may be the same or different, whether or not compressed model 152 and compressed model 154 are the same.

In an example, each computing device 110, 112, 114 may run respective compressed models 150, 152, 154 that each use corresponding compressed embedding tables 160, 162, 164. In an example, a computing device such as computing device 112 receives, loads, and/or otherwise obtains compressed embedding tables 162. For example, compressed embedding tables 162 may be associated with a compressed model 160 stored on or otherwise available to computing device 112. In one example, compressed model 160 itself may be decompressed into a model 120, that utilizes compressed embedding tables 162. In some examples, a model 120 or compressed model 160 may be run by one or more applications executed by computing device 112.

In an example, a model 120 or compressed model 150, 152, 154 may provide one or more lookup and decompression operations (not shown) configured to perform lookup and decompression on corresponding compressed embedding tables 160, 162, 164 comprising individually compressed embeddings. For example, computing device 112 may run a compressed model 152 that receives input for locating an embedding in a corresponding compressed embedding table 162. The compressed model 152 then may determine a lookup value to use for searching indexes of the corresponding compressed embedding table 162 to locate an embedding associated with the input. For example, the compressed model 152 may perform one or more operations on the input or some derivation thereof according to a mapping that determines the lookup value of an index in a compressed embedding table 162 to locate based on the input.

In an example, the compressed model 152 searches the indexes of compressed embedding table 162 using the determined lookup value to locate an individually compressed embedding. The compressed model 152 then decompresses the individually compressed embedding independent of any other embedding in the embedding table to obtain the decompressed value(s) associated with the individually compressed embedding that was located. As such, compressed model 152 may perform lookup and decompression of individually compressed embeddings within a respective compressed embedding table 162 based on specific input without decompressing and/or loading any other unrelated embedding or portion of the compressed embedding table 162 into memory.

In various examples, compressed embedding tables 162 store individually compressed embeddings and indexes where the individually compressed embeddings each correspond to one of the indexes. Further, individually compressed embeddings generally may include or refer to any associated compressed storage unit including, but not limited to, individually compressed records, entries, rows, tuples, and/or any other type of logical or physical storage unit holding individually compressed embeddings in compressed embedding tables 162.

Figure 1B:
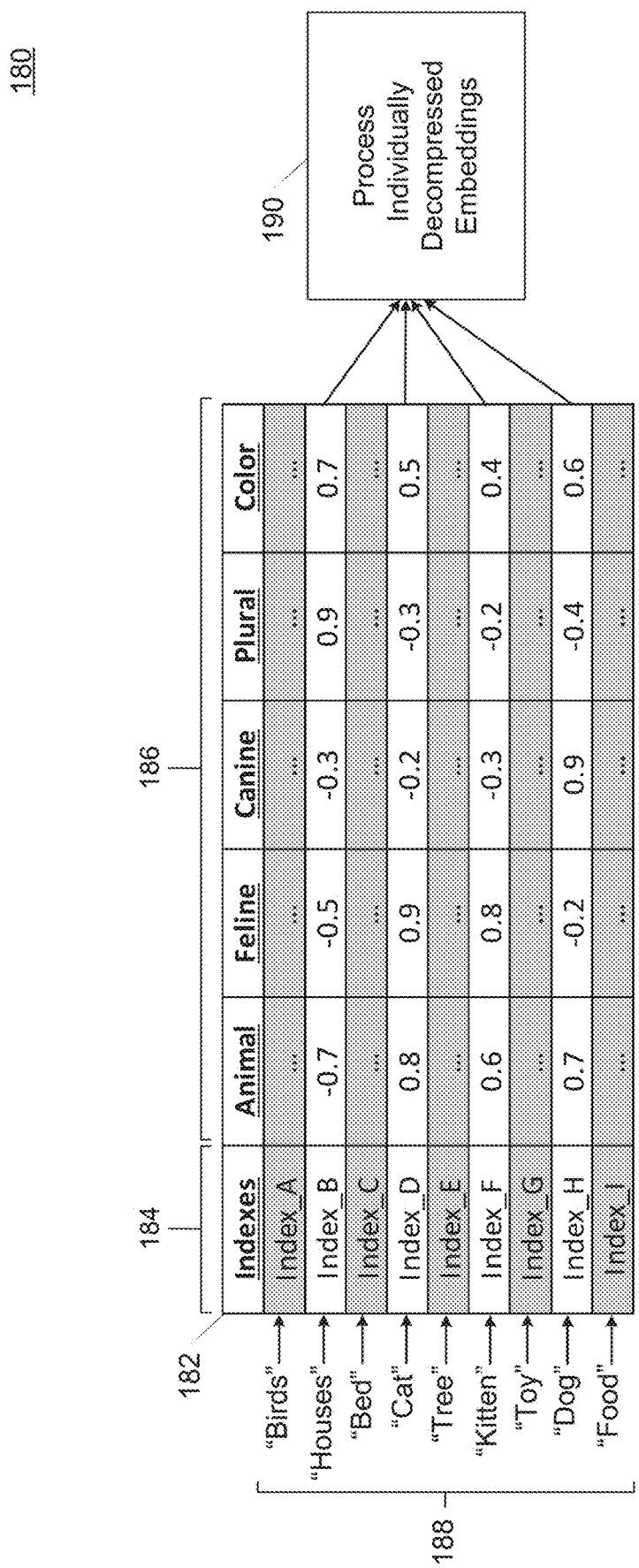
FIG. 1B depicts a block diagram of an example embedding table for providing efficient embedding table storage and lookup in machine-learning models according to example embodiments of the present disclosure.

FIG. 1B depicts a block diagram of an example embedding table for providing efficient embedding table storage and lookup in machine-learning models according to example embodiments of the present disclosure. Example embedding table 180 includes an embedding table data structure 182, embedding table indexes 184, embeddings 186, input values 188, and processing of individually decompressed embeddings 190.

In an example, embedding table data structure 182 may be an embedding table that comprises individually compressed embeddings 186. For example, embedding table data structure 182 may comprise multiple different rows or entries each having an embedding table index 184 referencing a corresponding, individually compressed embedding 186. In one example, each row in embedding table data structure 182 comprises an embedding table index 184 (Index_A, Index_B, Index_C, etc.) referencing a corresponding, individually compressed embedding 186.

Generally, embedding table indexes 184 may be a unique value or key used to lookup an embedding 186 comprising one or more values. In some examples, each embedding 186 includes a collection of one or more numerical values, such as a vector of numerical values, that project a particular object onto an object space (e.g., a two-dimensional, three-dimensional, or any other type of object space with any number of dimensions). For example, each embedding 186 in embedding table data structure 182 may comprise a set of numeric values with each numeric value corresponding to a weight associated with a particular dimension (e.g., a measurable attribute). Generally, embedding values may be set by default, provided from another source, generated as a result of training, updated as a result of training and/or retraining, etc.

In one example, each embedding 186 in embedding table data structure 182 comprises a numeric weight value associated with an "Animal" dimension for an input value 188, a numeric weight associated with a "Feline" dimension for the input value 188, and so on and so forth. As such, in embedding table data structure 182, the collection of numeric values for each of the dimensions ("Animal", "Feline", "Canine", "Plural", and "Color") in a particular row generally represents an embedding 186 associated with a particular input value 188. For example, row #2 of embedding table data structure 182 represents an embedding 186 comprising a set of numerical values (−0.7, −0.5, −0.3, 0.9, 0.7), each value being associated with a respective dimension corresponding to the input value 188 of "Houses". Further, the embedding 186 of row #2 of embedding table data structure may be located and referenced among various embedding table indexes 184 using "Index_B", for example, based on a mapping between "Index_B" and the input value 188 of "Houses".

In an example, each embedding 186 in each row of embedding table data structure 182 is individually compressed independent from any other embedding in any other row. For example, embedding 186 in row #1 of embedding table data structure 182 may be compressed individually and separate from all other embeddings 186 in other rows #2 through #9 of the embedding table data structure 182. Similarly, each of the other embeddings 186 also may be individually compressed independent from any other embedding in 186 in embedding table data structure 182. As such, each individually compressed embedding 186 of embedding table data structure 182 may be individually accessed via a corresponding embedding table index 184 and decompressed independently from other embeddings 186, for example, to avoid decompressing, loading, and/or processing an entire embedding table data structure 182 in memory.

In an example, each embedding table index 184 of embedding table data structure 182 is generated based on an input value 188. For example, "Index_A" of embedding table data structure 182 may be generated based on an input value 188 of "Birds". In various examples, each input value 188 is mapped to a corresponding embedding table index 184 deterministically. For example, one or more hashing and/or other operations are applied to an input value 188 to generate a corresponding embedding table index 184. As such, each embedding table index 184 may be determined based on particular input value 188 and used to locate and individually decompress an associated embedding 186 in embedding table data structure 182.

In an example, embedding table indexes 184 are used to lookup and individually decompress associated embeddings 186 in embedding table data structure 182. In one example, one or more input values 188 are received for processing. For example, input values 188 of "Houses", "Cat, "Kitten", and "Dog" may be received. Each of these input values 188 may be processed individually, for example, using hashing and/or one or more other operations to determine a corresponding embedding table index 184. For example, the "Houses" input value 188 may be processed to determine the embedding table index 184 of "Index_B" to use when searching embedding table indexes 184 of embedding table data structure 182 for an embedding 186 associated with "Houses".

In an example, the embedding table index 184 of "Index_B" is found at row #2 of embedding table data structure 182 where the associated embedding 186 is accessed and individually decompressed independent of other embeddings in embedding table data structure 182. The input values 188 of "Cat", "Kitten", and "Dog" may be processed similarly to individually locate and individually decompress particular embeddings 186 in embedding table data structure 182. In various examples, processing of individually decompressed embeddings 190 may include, but is not limited to averaging, concatenating, utilizing, returning, forwarding, and/or performing any other operations involving individually decompressed embeddings 186 obtained from embedding table data structure 182.

Figure 2:
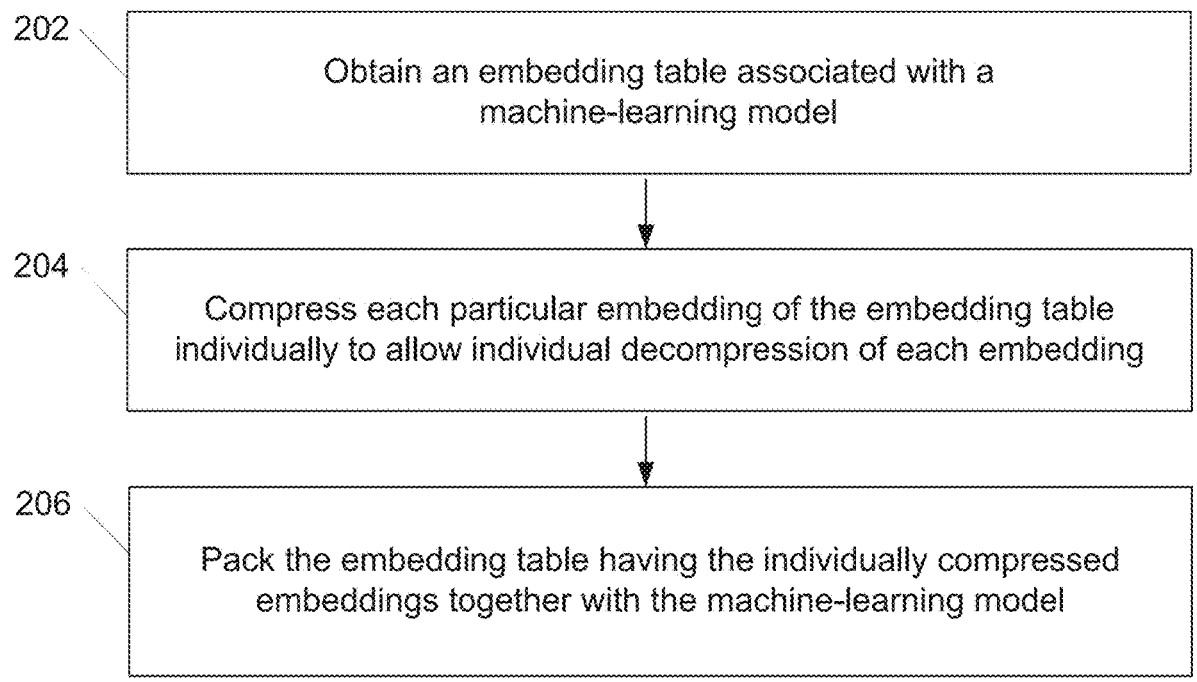
FIG. 2 depicts a flow diagram of an example method for providing efficient embedding table storage for machine-learning models according to example embodiments of the present disclosure.

Example Methods for Efficient Embedding Table Storage & Lookup in Machine-Learning Models FIG. 2 depicts a flow diagram of an example method for providing efficient embedding table storage for machine-learning models according to example embodiments of the present disclosure. Although FIG. 2 depicts steps performed in a particular order for purposes of illustration and discussion as an example, the methods of the present disclosure are not limited to the particularly illustrated order or arrangement. The various steps of the method 200 can be omitted, rearranged, combined, and/or adapted in various ways without deviating from the scope of the present disclosure.

At 202, a computing system obtains an embedding table associated with a machine learning model. In an example, a computing system 110 obtains one or more embedding tables 130. For example, the computing system 110 may receive an embedding table 130 or a location of an embedding table 130 as input. The computing system 110 also may detect one or more embedding tables 130, for example, automatically based on analyzing an associated model 120 or a compressed model 150 associated with the embedding tables 130.

In an example, the computing system 110 may receive input, such as a list or collection of objects and associated embeddings that are used to generate one or more embedding tables 130. For example, the computing system 110 may receive a list or collection of words in a vocabulary, such as dictionary words in a particular language. The computing system 110 then may use the list or collection of words to generate an associated embedding table 130, for example, based on existing or known embeddings, default or generic embeddings, and/or generally any type of embeddings that are to be respectively associated with each respective entry of the embedding table 130. In some examples, the computing system 110 receives multiple different lists or collections of words each associated with a different language (e.g., 2, 10, 100, or more languages) where each list or collection of words from a particular language is used to generate a corresponding embedding table 130. In such examples, each list or collection of words in a particular language would have its own particular embedding table 130.

In an example, the computing system 110 may generate, convert, or otherwise update one or more indexes of an existing embedding table 130. For example, one or more entries of an embedding 130 table obtained or received by the computing system 110 already may have a respective index value associated with a corresponding embedding. In one example, existing index values of an embedding table 130 associated with a vocabulary of words may be the actual words or some derivative thereof (e.g., unigrams, bigrams, trigrams, etc. of the words) corresponding to particular embeddings. As such, the computing system 110 may determine an index value for each embedding based on existing index values present in an embedding table 130 or from one or more external collections or lists of values (e.g., words, objects, or any derivations thereof) that are not present in an embedding table 130.

In an example, the computing system 110 determines one or more index values for an embedding table 130 based on applying a hashing operation to each of one or more values that are to be associated with a particular embedding from the embedding table 130. As such, the computing system may determine new index values based on existing index values from an existing embedding table 130 or based on a list or collection of objects (e.g., words, entities, tokens, labels, etc.) being used to generate and/or augment an embedding table 130.

In an example, the computing system 110 generates, converts, or otherwise updates index values for an embedding table 130 in association with performing compression operations 140. In various examples, one or more operations, including but not limited to hashing operations, are applied to input values to generate embedding table 130 indexes that are each deterministically mapped to the corresponding input. In addition, any related hashing operations may utilize a hash seed. In some examples, the one or more operations used to generate embedding table 130 indexes in some instances may map multiple different input values to the same index of an embedding table 130, thus reducing an overall number of entries and size of an embedding table 130. In some examples, the one or more operations used to generate embedding table 130 indexes generally may include one or more operations that precede and/or follow hashing operations performed on any particular value.

At 204, the computing system compresses each particular embedding of the embedding table individually to allow individual decompression of each particular embedding independent of other embeddings in the embedding table. In an example, a computing system 110 uses compression operations 140 to individually compress each of one or more embeddings in an embedding table 130. For example, compression operations 140 may be used to individually compress each respective embedding in an embedding table 130. In various examples, individual compression of each particular embedding generally allows each embedding or embedding entry to be individually decompressed and accessed, for example, without decompressing and/or loading any other unrelated embedding from embedding table 130 into memory.

In an example, compression operations 140 are performed independent from any underlying machine-learning platform. For example, compression operations 140 may be performed by software that is separate and unassociated with an underlying machine learning platform. In various examples, such software may be provided, for example, as a software application, script, utility, library, and/or tool providing specialized operations not provided by a machine-learning platform. Further, compression operations 140 generally may provide one or more different compression schemes that are unavailable from or otherwise unsupported by an underlying machine-learning platform. In some examples, compression operations 140 may individually compress embeddings of an embedding table 130, for example, based on a selection of one or more available compression schemes, which may include, but are not limited to quantization compression, k-means compression, and/or pruning compression. However, generally any such type of compression scheme or operations, including custom and/or later-known compression operations, may be provided to generate compressed embedding tables 160 independent and apart from an underlying machine-learning platform.

In an example, compression operations 140 may individually compress each embedding of an embedding table 130 so that each embedding entry of the embedding table is treated independent from other embeddings of the embedding table 130. As such, a model 120 may perform self-contained lookup and decompression of each particular embedding entry in the embedding table 130 in a single operation without use of an underlying machine-learning platform. In some examples, downstream lookup and decompression operations for compressed embedding tables 160 are performed automatically by the model 120 itself. In some examples, such downstream lookup and decompression operations for compressed embedding tables 160 also may be supported, for example in whole or in part, by an accompanying lightweight software framework or library associated with compression operations 140.

In some examples, models 120 and/or compressed models 150 may be modified or adjusted to individually decompress particular embeddings independent of other embeddings in compressed embedding tables 160, for example, when a model 120, 150 is packed with compressed embedding tables 160 having individually compressed embeddings. For example, such models 120, 150 may be modified, adjusted, configured, or reconfigured (e.g., by compression operations 140) to directly decompress a particular individually compressed embedding as part of a corresponding lookup operation performed on a compressed embedding table 160.

In various examples, an underlying machine-learning platform generally may not recognize or be aware of compressed embedding tables 160 or the associated lookup and decompression of particular embeddings performed by a model 120 or compressed model 150. As such, individual decompression of particular embeddings can be performed without activating operations of an underlying machine-learning platform that, for example, may otherwise attempt to decompress an entire compressed embedding table 160 at once, whether or not the underlying compression scheme actually would be understood or supported by the underlying machine-learning platform.

At 206, the computing system packs the embedding table having the individually compressed embeddings together with the machine learning model. In an example, a computing system 110 packs compressed embedding tables 160 with an associated model 120 or compressed model 150. For example, the computing system 110 may package a compressed model 150 and the associated compressed embedding tables 160 together so that the compressed embedding tables 160 are combined with or become part of the compressed model. In various examples, compressed model 150 and compressed embedding tables 160 may be stored, deployed, transmitted, transferred and/or run on each of one or more other different computing devices. For example, compressed model 150 and compressed embedding tables 160 may be stored and run on computing device 110. In addition, one or more instances of compressed model 150 and compressed embedding tables 160 may be created or copied, and then transferred to run on each of one or more other computing devices 112, 114.

Figure 3:
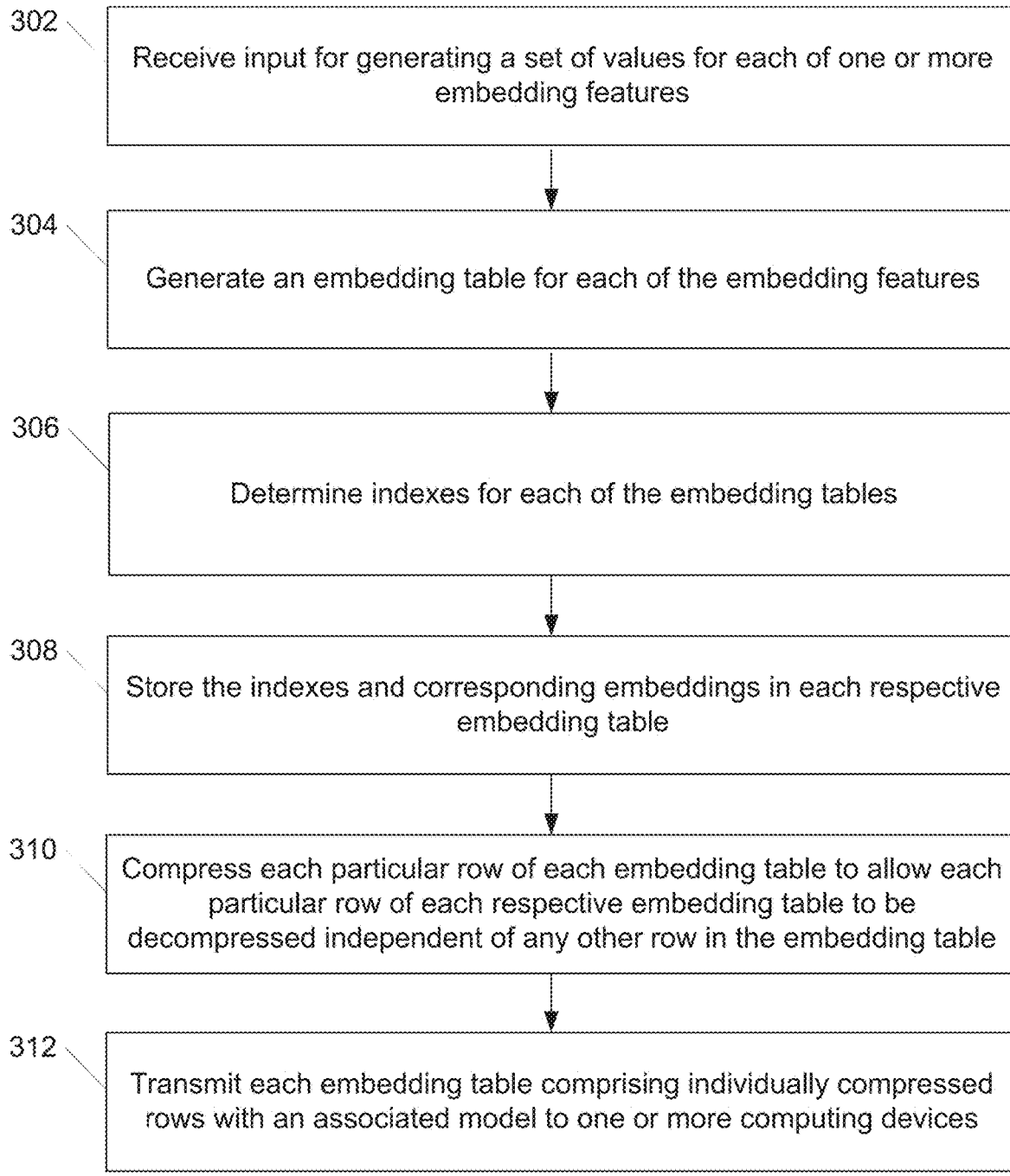
FIG. 3 depicts a block diagram of an example for providing efficient embedding table storage for machine-learning models according to example embodiments of the present disclosure.

FIG. 3 depicts a flow diagram of an example method for providing efficient embedding table storage for machine-learning models according to example embodiments of the present disclosure. Although FIG. 3 depicts steps performed in a particular order for purposes of illustration and discussion as an example, the methods of the present disclosure are not limited to the particularly illustrated order or arrangement. The various steps of the method 300 can be omitted, rearranged, combined, and/or adapted in various ways without deviating from the scope of the present disclosure.

At 302, a computing system receives input for generating a set of values for each of one or more embedding features. In an example, a computing system 110 receives or otherwise obtains data to use for generating one or more embedding tables 130. For example, a corresponding embedding table 130 may be created for each of one or more embedding features extracted from or otherwise associated with text, audio, or visual input data.

In some examples, embedding features may be determined or extracted directly from input based on analyzing the input. For example, a contiguous sequence of letters or words can be derived from words in text or speech. In some examples, embedding features also may be provided or otherwise associated with input. For example, one or more category or classification descriptors can be provided with audio or visual input. In one example, video input may be classified in one or more ways, including by rating, by genre, era, popularity, studio, etc.

In an example, one or more embedding features may be extracted or determined based on input with each set of values extracted or determined for an embedding feature being used to generate a corresponding embedding table 130 for use with a machine-learning model. For example, a first set of one or more values may be extracted or determined from input data for a particular embedding feature, such as unigrams for language models. A second set of one or more values then may be extracted or determined from the input data for a different embedding feature, such as bigrams for language models. In addition, one or more other sets of values may be generated for each additional embedding feature, such as trigrams, four-grams, five-grams, etc. Further, each one of the sets of values associated with a respective embedding feature (e.g., unigram, bigram, trigram, etc.) then may be used to generate a corresponding embedding table 130 for use with a machine-learning model 120. For example, a first embedding table 130 may be generated for a set of values associated with unigrams, a second embedding table 130 may be generated for another set of values associated with bigrams, and so on and so forth. In various examples, such embedding tables 130 may be used with one or more types of machine-learning models, including by not limited to models 120 pertaining to natural language processing (NLP).

At 304, the computing system generates an embedding table 130 for each of one or more embedding features associated with input. In an example, the computing system 110 may generate embedding tables 130 as a two-dimensional data structure that at least comprises a plurality of indexes and a plurality of embeddings with each embedding being referenced by a particular one of the indexes. In some examples, embedding tables 130 may store, reference, or utilize other data and/or features. For example, each row of an embedding table may comprise one or more fields in addition to an embedding table index and an embedding corresponding to the index.

In various examples, the computing system may generate one or more embedding tables 130 by creating a new embedding table 130 based on input data, based on data determined or extracted from input data, based on an existing embedding table 130, etc. In some examples, the computing system 110 may generate an embedding table 130 by creating a new embedding table 130 and inserting associated data accordingly, creating a copy of an existing embedding table 130 and updating the copy accordingly, and/or directly performing operations on an existing embedding table 130 to convert, augment, edit, or otherwise update data in the existing embedding table 130 with new information. In an example, the computing system 110 generates one or more respective embedding tables 130 each corresponding to a particular embedding feature of input, for example, based on example operations performed at 306, 308, and 310 as discussed below.

At 306, the computing system determines indexes for each of the embedding tables. In an example, a computing system 110 extracts and/or determines a set of values for each of multiple different embedding features, for example, based on analyzing input. The computing system 110 then references the respective set of values associated with a particular embedding feature to generate a corresponding embedding table 130.

In an example, the computing system 110 processes words from a vocabulary in a particular language. The computing system 110 analyzes the words and extracts or determines one or more embedding features associated with each of the words. For example, the computing system 110 may utilize n-gram embedding features to generate embedding tables to use for natural language processing (NLP) machine-learning models 120. In an example, the computing system 110 generates a set of values for each of one or more embedding features based on word input. For example, a set of letter values may be generated for a unigram embedding feature. A second set of letter combinations may be generated for a bigram embedding feature. In addition, a third set of letter combinations may be generated for a trigram embedding feature.

In an example, the computing system 110 determines indexes for a first embedding table corresponding to the unigram embedding feature by performing one or more hashing and/or other operations on each value in the set of values associated with the unigram embedding feature to generate embedding table indexes that are mapped to the original unigram values. Continuing with the example, the computing system 110 determines indexes for a second embedding table corresponding to the bigram embedding feature by performing one or more hashing and/or other operations on each value in the set of values associated with the bigram embedding feature to generate embedding table indexes mapped to the original bigram values. Further, the computing system 110 determines indexes for a third embedding table corresponding to the trigram embedding feature by performing one or more hashing and/or other operations on each value in the set of values associated with the trigram embedding feature to generate embedding table indexes mapped to the original trigram values.

In various examples, each of the determined indexes for an embedding table 130 are mapped to values associated with a respective embedding feature. Further, each one of the indexes may be used to look up an associated embedding in a particular embedding table 130 and/or compressed embedding table 160. In some examples, multiple different values may be mapped to the same index and associated embedding based on the mapping provided by the one or more hashing and/or other operations, thus reducing an overall number of entries and size of an embedding table 130.

At 308, the computing system stores the indexes and corresponding embeddings in each respective embedding table. In an example, the computing system 110 stores indexes determined from input with their respective, corresponding embeddings in an embedding table 130. For example, the computing system 110 may store a particular set of indexes and corresponding embeddings associated with one embedding feature in one embedding table while storing another particular set of indexes and corresponding embeddings of another embedding features in a different embedding table 130. In addition, one or more of such embedding tables 130 may be used alone or together in association with any number of machine-learning models 120. In various examples, one or more embeddings of an embedding table may be provided, predetermined, set by default, learned as part of training a particular embedding table 130, learned as part of training a particular embedding table 130 with a model 120, and/or determined and updated in other ways.

At 310, the computing system compresses each particular row of each embedding table to allow each particular row of a respective embedding table to be decompressed independent of any other row in the respective embedding table. In an example, a computing system 110 compresses each embedding in an embedding table 130 to be individually located and decompressed independent of any other embedding. For example, the computing system 110 may compress individual embeddings for each of one or more different embedding tables 130. In an example, each of multiple different embedding tables may be stacked and combined into a single unit (e.g., tensor) that may be later unpacked when an associated model 120 or compressed model 150 performs an operation (e.g., a lookup operation) involving one or more of the respective, corresponding compressed embedding tables 160. In one example, such embedding table stacking may be provided by compression operations 140. In addition, unstacking of the embedding tables may be performed, for example, by a model 120 or a compressed model 150.

In an example, embeddings of a particular embedding table 130 may be individually compressed to generate compressed embedding tables 160 whether or not such compression operations and/or an associated compression scheme are available or supported by an underlying machine-learning platform of any source computing machine and/or any target computing machine. As such, generally any type of compression, including custom and/or later-known compression operations, may be used to individually compress embeddings of an embedding tables 130 to generate compressed embedding tables 160 that may be utilized by a model 120 or compressed model 150 independent and apart from any underlying machine-learning platform. In some examples, embeddings of an embedding table 130 may be compressed using custom quantization compression, custom pruning compression, custom k-means compression and/or using any custom or specialized compression that otherwise is unavailable from or unsupported by a machine-learning platform.

At 312, the computing system transmits each embedding table comprising individually compressed rows with an associated model to one or more computing devices. In an example, a computing system 110 uses compression operations 140 that compress a model 120 and generate a compressed model 150 packed with one or more compressed embedding tables 160. In some examples, generating and/or packing a compressed model with one or more compressed embedding tables 160 may involve one or more operations that configure compressed model 150 to perform individual decompression of embeddings based on a compression scheme used to individually compress embeddings of compressed embedding tables 160. For example, a compressed model 150 may be adjusted or otherwise configured or reconfigured to directly decompress a particular individually compressed embedding according to a particular compression scheme that is not supported by an underlying machine-learning platform as part of a corresponding lookup operation performed on a compressed embedding table 160.

In an example, a compressed model 150 and associated compressed embedding tables 160 are packed together and provided to one or more computer systems to be run. For example, compressed model 150 and compressed embedding tables 160 may be transmitted, deployed, or otherwise transferred from one computing device 110 to one or more other computing devices 112, 114 to be run accordingly.

Figure 4:
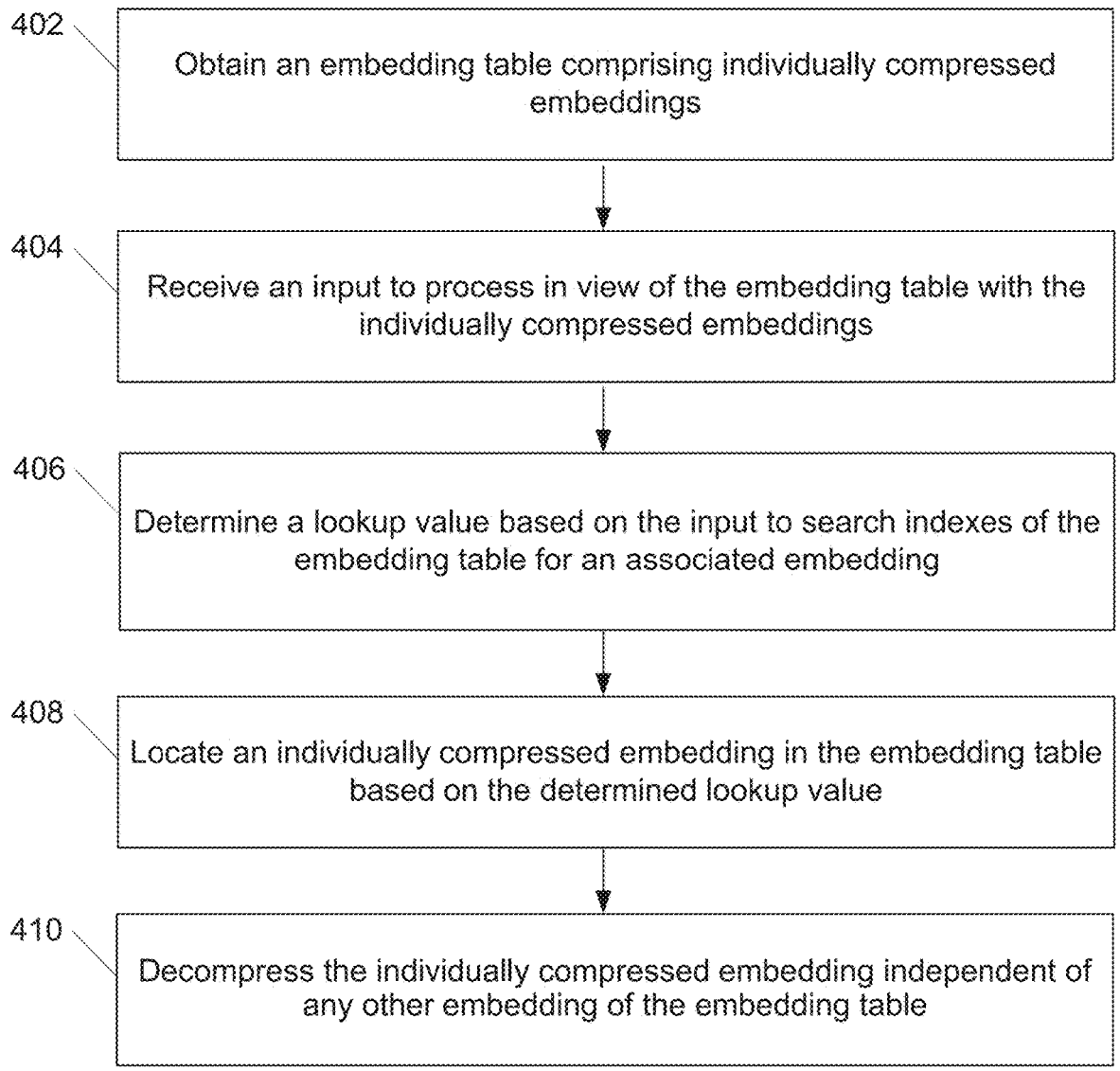
FIG. 4 depicts a flow diagram of an example method for providing efficient embedding table storage and look-up for machine-learning models according to example embodiments of the present disclosure.

FIG. 4 depicts a flow diagram of an example method for providing efficient embedding table storage and look-up for machine-learning models according to example embodiments of the present disclosure. Although FIG. 4 depicts steps performed in a particular order for purposes of illustration and discussion as an example, the methods of the present disclosure are not limited to the particularly illustrated order or arrangement. The various steps of the method 400 can be omitted, rearranged, combined, and/or adapted in various ways without deviating from the scope of the present disclosure.

At 402, a computing system obtains an embedding table comprising individually compressed embeddings. In an example, a computing system, for example such as computing system 112, obtains a compressed embedding table 162 comprising indexes and individually compressed embeddings. For example, the indexes of the compressed embedding table 162 generally may reference one of multiple individually compressed embeddings that can be decompressed independent from any other embedding in the compressed embedding table 162. In some examples, computing system 112 may receive one or more compressed embedding tables 162 packed with a compressed model 152. Similarly, computing system 114 may receive one or more compressed embedding tables 164 packed with a compressed model 154.

At 404, the computing system receives input for processing in view of the embedding table comprising individually compressed embeddings. In an example, a compressed model 152 running on computing system 112 receives input to process using one or more compressed embedding tables 162. For example, the compressed model 152 may be a neural network model that uses compressed embedding tables 162 to process input. In one example, the compressed model 152 may be directed to one or more aspects of natural language processing (NLP), such as language classification, speech recognition, speech segmentation, etc. In addition, each of one or more compressed embedding tables 162 may store word embeddings associated with a vocabulary in a particular language. For example, different compressed embedding tables 162 each may be used to store word embeddings from various different languages.

At 406, the computing system determines a lookup value based on the input to search indexes of the embedding table for an associated embedding. In an example, the compressed model 152 uses the input to determine a lookup value that is used to find embeddings in one or more compressed embedding tables 162. In some examples, the compressed model 152 analyzes the input and extracts one or more features from the input to use as lookup values for locating embeddings in one or more compressed embedding tables 162.

In an example, the compressed model 152 may analyze a word as input and extract one or more lookup values based on the word. For example, the compressed model 152 may determine and extract a root of the word to use as a lookup value. In another example, compressed model 152 may determine and extract one or more unigrams to use as lookup values based on word input. Similarly, the compressed model 152 may determine and extract one or more bigrams, trigrams and/or one or more other groups of values based on any embedding feature(s) to use as lookup values based on word input. Although the examples above mention words as example input, generally any type of data representing any sort of information or content (e.g., audio, visual, textual, etc.) may be utilized to determine lookup values for locating embeddings in compressed embedding tables 162 based on any one or more embedding features.

At 408, the computing system locates an individually compressed embedding in the embedding table based on the determined lookup value. In an example, the compressed model 152 uses a lookup value that has been determined from input, for example at 406, to locate an embedding in an associated compressed embedding table 162. For example, the compressed model 152 may use a determined lookup value or some variant of the determined lookup value based on a mapping associated with indexes of a compressed embedding table 162 to search the indexes to find a corresponding embedding in the compressed embedding table 162.

In an example, the compressed model 152 processes a determined lookup value using one or more hashing and/or other operations associated with indexes of a compressed embedding table. 162. For example, indexes of an obtained embedding table 162 may be associated with one or more hashing and/or other operations used to map input data to embedding table index values. In some examples, such mappings generally may in some instances map different possible input values to the same index in the compressed embedding table 152, thus reducing an overall number of entries and reducing the size of the compressed embedding table 152. In some examples, the one or more hashing and/or other operations may include one or more data processing operations that may precede and/or follow any particular hashing that may be performed.

In an example, the compressed model 152 performs the one or more hashing operations on the determined lookup value to search the indexes of a compressed embedding table 162. The compressed model 152 then performs a lookup operation to search the indexes of the compressed embedding table 162 using the result of the one or more hashing operations on the determined lookup value. The compressed model then locates one of the indexes in the compressed embedding table 162 matching the result of the hashing operations to obtain an associated embedding.

At 410, the computing system decompresses an individually compressed embedding independent of any other embedding in the embedding table. In an example, a compressed model 152 locates one of the indexes in a compressed embedding table 162 with the particular index corresponding to one of the individually compressed embeddings of the compressed embedding table 162. The compressed model 152 decompresses the particular embedding by individually decompressing the particular embedding independent of any other embedding of the compressed embedding table 162. In various examples, the compressed model individually decompresses respective entries of compressed embedding tables 162 independent of an underlying machine-learning platform, for example, based on compression that is unavailable from or otherwise unsupported by a machine-learning platform used to run the compressed model 152. In some examples, the compressed model 152 may be configured to perform lookup and individual decompression of individually compressed embedding as part of a single operation. Further, the compressed model 152 may be configured such that the lookup and individual decompression of individually compressed embeddings is self-contained and not visible to an underlying machine-learning platform or users thereof.

Figure 5:
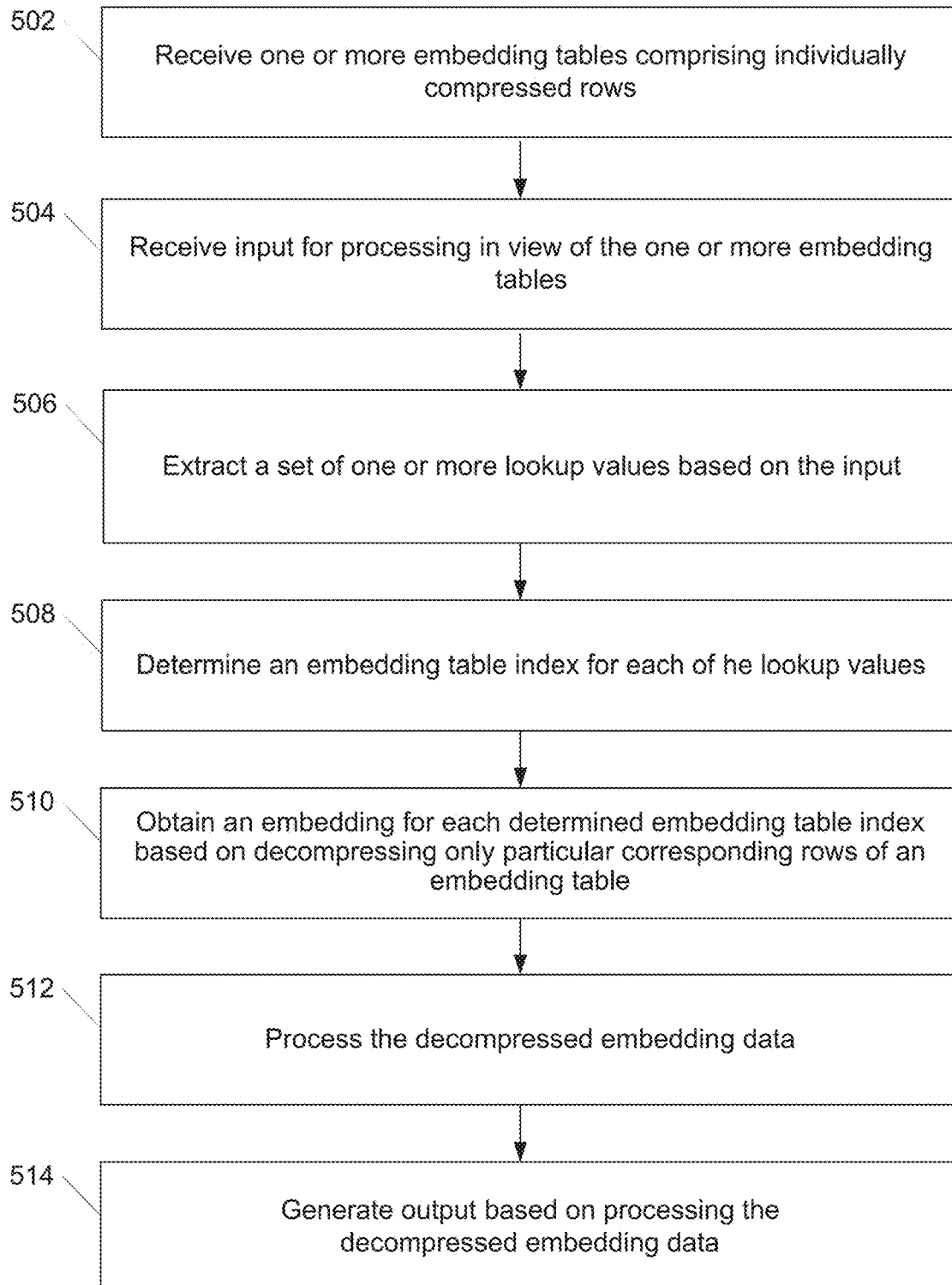
FIG. 5 depicts a block diagram of an example for providing efficient embedding table storage and look-up for machine-learning models according to example embodiments of the present disclosure.

FIG. 5 depicts a flow diagram of an example method for providing efficient embedding table storage and look-up for machine-learning models according to example embodiments of the present disclosure. Although FIG. 5 depicts steps performed in a particular order for purposes of illustration and discussion as an example, the methods of the present disclosure are not limited to the particularly illustrated order or arrangement. The various steps of the method 500 can be omitted, rearranged, combined, and/or adapted in various ways without deviating from the scope of the present disclosure.

At 502, a computing system receives one or more embedding tables comprising individually compressed rows. In an example, a computing system (e.g., computing system 112) receives one or more compressed embedding tables 162 packed with a compressed model 152. In various examples, each compressed embedding table 162 stores individually compressed embeddings each associated with one of the indexes of the corresponding compressed embedding table 162. Further, each of the individually compressed embeddings may be individually decompressed independent from and without decompressing any other embedding in the compressed embedding table.

In some examples, each of the one or more compressed embedding tables 162 is based on a particular embedding feature of word embeddings. For example, a collection of one or more compressed embedding tables 162 may be associated with n-gram embedding features. For example, one of the compressed embedding tables 162 may store indexes and embeddings associated with word unigrams. A second one of the compressed embedding tables 162 may store indexes and embeddings associated with word bigrams. Further, a third one of the compressed embedding tables 162 may store indexes and embeddings associated with word trigrams. Although unigram, bigram, and trigram embedding features generally are described in the examples above, compressed embedding tables 162 may be used for any type of embedding features associated with any type of data and are not limited to textual data or embedding features of textual data.

At 504, the computing system receives input for processing in view of the one or more embedding tables. In an example, a compressed model 152 running on computing system 112 receives input to process using one or more compressed embedding tables 162. For example, input may include any type of data associated with audio, visual, textual, and/or any other type of content. In some examples, input may be words or phrases being processed by a compressed model 152 associated with natural language processing (NLP). Further, each of one or more compressed embedding tables 162 may store word embeddings used by the compressed model 152 when processing input.

In some examples, the compressed model 152 may receive one or more inputs, such as words in a phrase or sentence, and process each of the words as input. For example, each word in a sentence may be processed individually using one or more compressed embedding tables 162. For example, a single word, such as "hello" may be processed as input using a compressed embedding table 162 based on unigrams, a compressed embedding table 162 based on bigrams, and/or a compressed embedding table 162 based on trigrams (and/or any other types of embedding features). In some examples, groupings of words that each comprise one or more words also may be processed as input.

At 506, the computing system extracts a set of one or more lookup values based on the input. In an example, the compressed model 152 analyzes the input and extracts one or more embedding features from the input to use as lookup values for locating embeddings in compressed embedding tables 162. In one example, the compressed model 152 may receive a word such as "hello" and extract embedding features, such as unigrams of "hello" (e.g., bigrams of "hello" (e.g., 'he', 'el', 'l', 'lo'), trigrams of "hello" (e.g., 'hel' 'ell', 'llo'), etc. to process using corresponding compressed embedding tables 162 associated with each of the particular embedding features. For example, unigrams of "hello" may be processed using a compressed embedding table 162 of unigrams, bigrams of "hello" may be processed using another compressed embedding table of bigrams, and so on and so forth. In addition, the compressed model 152 generally may process any number of inputs (e.g., tokens, entities, objects) based on any number of embedding features corresponding to at least one compressed embedding table 162. Further, any type of input generally may be processed based on any one or more embedding features.

At 508, the computing system determines an embedding table index for each of the lookup values. In an example, the compressed model 152 processes each lookup value using one or more hashing and/or other operations to determine an embedding table index to locate in a compressed embedding table 162. For example, the compressed model 152 may process each particular unigram value determined for "hello" by applying one or more hashing and/or other operations to each unigram value where the one or more hashing and/or other operations map unigram values to embedding table index values of a corresponding compressed embedding table 162. The compressed model 152 then may use the determined embedding table indexes to locate associated unigram embeddings in the compressed embedding table 162. In other examples, bigrams, trigrams, and/or any other embedding features may be processed similarly to obtain one or more embedding table indexes for corresponding compressed embedding tables 162.

At 510, the computing system obtains an embedding for each determined embedding table index based on decompressing only particular corresponding rows of a corresponding embedding table. In an example, a compressed model 152 uses an embedding table index value determined from a lookup value to search indexes of a compressed embedding table 162. For example, the compressed model 152 locates one of the indexes in the compressed embedding table matching the embedding table index value determined from the lookup value, and individually decompresses a particular embedding of the compressed embedding table 162 associated with the located index. In particular, the compressed model 152 may decompress the particular individually compressed embedding of the compressed embedding table 162 by individually decompressing the particular embedding independent of and without decompressing any other embedding of the compressed embedding table 162.

In some examples, a compressed model 152 locates and individually decompresses one or more embeddings based on embedding features associated with input. For example, the compressed model 152 may determine embedding table indexes for each unigram embedding feature value associated with the word "hello" as input. The compressed model 152 then may search a corresponding unigram compressed embedding table 162 for each of the embedding table indexes and individually decompress each of the located embeddings based on a matching compressed embedding table 162 index. The compressed model then may process the individually decompressed embeddings from the compressed embedding table 162.

In some examples, the compressed model 152 may locate and individually decompress embeddings from other compressed embedding tables 162 associated with other embedding features. For example, the compressed model 152 also may determine embedding table indexes for each bigram embedding feature value associated with the word "hello", search a different corresponding bigram compressed embedding table 162 for each of those embedding table indexes, individually decompress each of the located embeddings based on a matching compressed embedding table 162 index, and process the decompressed embeddings accordingly. In various examples, the compressed model 152 may perform similar operations to locate and individually decompress embeddings from any compressed embedding table 162 corresponding to any embedding feature for any type of input.

At 512, the computing system processes the decompressed embedding data obtained from one or more compressed embedding tables. In an example, the compressed model 152 processes one or more sets of embedding data from individually decompressed embeddings of one or more compressed embedding tables 162. In various examples, the compressed model 152 uses the decompressed embedding data to run the model and to generate output. In some examples, the compressed model 152 averages multiple, different individually decompressed embeddings obtained from a compressed embedding table 162. In one example, the compressed model 152 may average multiple decompressed embeddings, such multiple different numeric vectors obtained for each of multiple different lookup values associated with an embedding feature. For example, the compressed model 152 may average or compute the embedding mean of numeric vectors obtained for lookup values associated with unigrams as an embedding feature, bigrams as an embedding feature, trigrams as an embedding feature, and/or based on any embedding features for any type of input. In some examples, the compressed model 152 may concatenate multiple decompressed embeddings, which may be further processed and/or provided as output of a particular operation or layer. In some examples, the compressed embedding model 152 may process individually decompressed embedding data from different embedding features by averaging, concatenating, and/or generally processing such data in any way. Further, the compressed model 152 may process any number of individually decompressed embeddings in any way to generate any type of output.

At 514, the computing system generates an output based on processing the decompressed embedding data obtained from each corresponding embedding table. In an example, the compressed model 152 may provide decompressed embedding data as output. In one example, decompressed embedding data may be provided as an average or computed mean of the decompressed embedding data obtained from one or more compressed embedding tables 162. In one example, such decompressed embedding data may be provided as combined or concatenated data. In some examples, the compressed model 152 provides a prediction, classification, determination, an/or other result based on analyzing and processing the decompressed embedding data obtained from one or more compressed embedding tables 162.

Example Devices and Systems

Figure 6A:
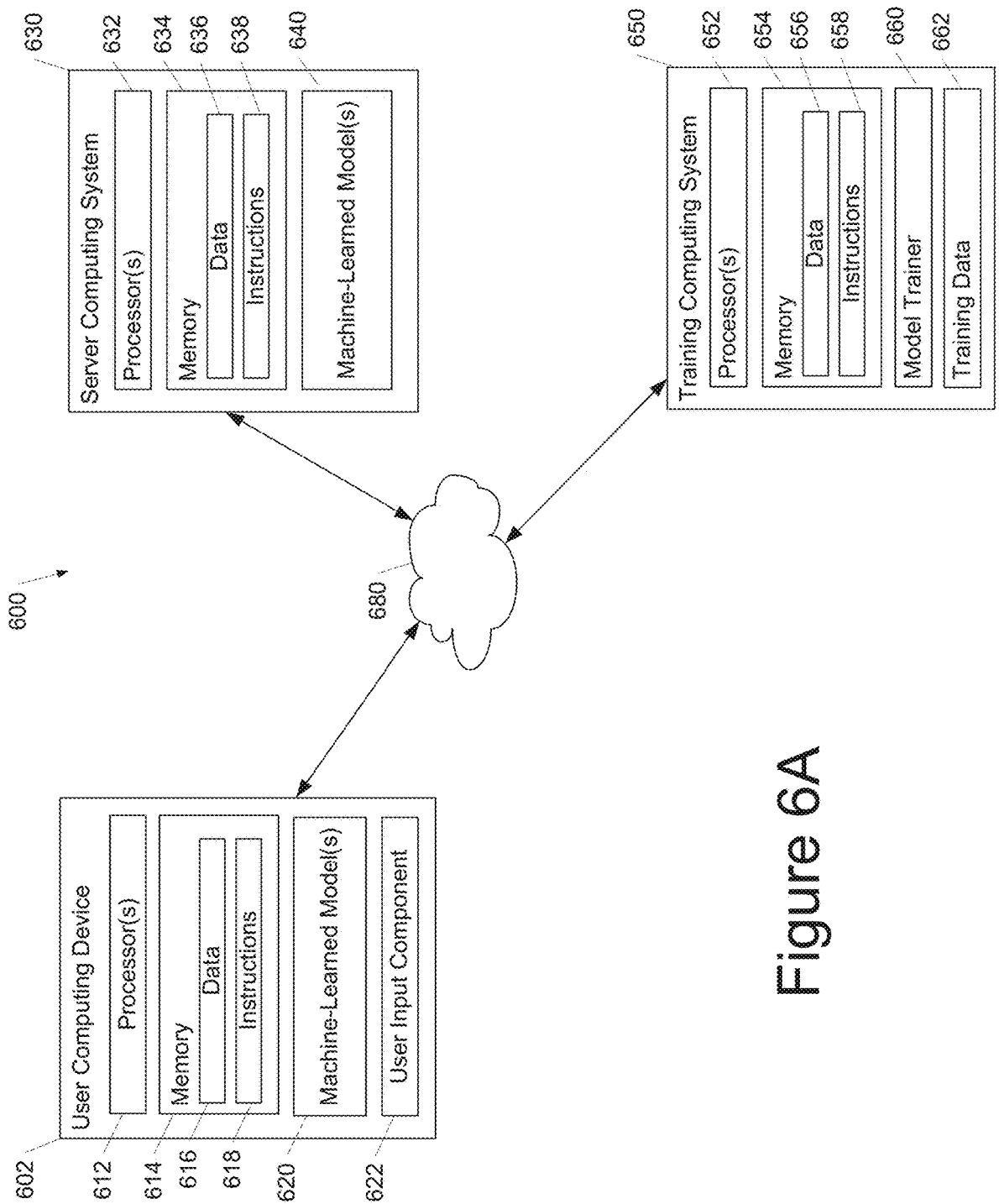
FIG. 6A depicts a block diagram of an example computing system that performs efficient embedding table storage and lookup according to example embodiments of the present disclosure.

FIG. 6A depicts a block diagram of an example computing system 600 that provides efficient embedding table storage and lookup in machine learning models according to example embodiments of the present disclosure. The example computing system 600 includes a user computing device 602, a server computing system 630, and a training computing system 650 that are communicatively coupled over a network 680.

The user computing device 602 can be any type of computing device, such as, for example, a personal computing device (e.g., laptop or desktop), a mobile computing device (e.g., smartphone or tablet), a gaming console or controller, a wearable computing device, an embedded computing device, or any other type of computing device.

The user computing device 602 includes one or more processors 612 and a memory 614. The one or more processors 612 can be any suitable processing device (e.g., a processor core, a microprocessor, an ASIC, an FPGA, a controller, a microcontroller, etc.) and can be one processor or a plurality of processors that are operatively connected. The memory 614 can include one or more non-transitory computer-readable storage media, such as RAM, ROM, EEPROM, EPROM, flash memory devices, magnetic disks, etc., and combinations thereof. The memory 614 can store data 616 and instructions 618 which are executed by the processor 612 to cause the user computing device 602 to perform operations.

In some examples, the user computing device 602 can store or include one or more machine-learned models 620. For example, the machine-learned models 620 can be or can otherwise include various machine-learned models such as neural networks (e.g., deep neural networks) or other types of machine-learned models, including non-linear models and/or linear models. Neural networks can include feed-forward neural networks, recurrent neural networks (e.g., long short-term memory recurrent neural networks), convolutional neural networks or other forms of neural networks. Some example machine-learned models can leverage an attention mechanism such as self-attention. For example, some example machine-learned models can include multi-headed self-attention models (e.g., transformer models). In some examples, machine-learned models include and use one or more embedding tables (not shown).

In some implementations, the one or more machine-learned models 620 can be received from the server computing system 630 over network 680, stored in the memory 614, and then used or otherwise implemented by the one or more processors 612. In some implementations, the user computing device 602 can implement multiple parallel instances of a single machine-learned model 620.

Additionally or alternatively, one or more machine-learned models 640 can be included in or otherwise stored and implemented by the server computing system 630 that communicates with the user computing device 602 according to a client-server relationship. For example, the machine-learned models 640 can be implemented by the server computing system 630 as a portion of a web service. Thus, one or more machine-learned models 620 and any associated embedding tables (not shown) can be stored and implemented at the user computing device 602 and/or one or more machine-learned models 640 and any associated embedding tables (not shown) can be stored and implemented at the server computing system 630.

The user computing device 602 can also include one or more user input components 622 that receive user input. For example, the user input component 622 can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, a traditional keyboard, or other means by which a user can provide user input.

The server computing system 630 includes one or more processors 632 and a memory 634. The one or more processors 632 can be any suitable processing device (e.g., a processor core, a microprocessor, an ASIC, an FPGA, a controller, a microcontroller, etc.) and can be one processor or a plurality of processors that are operatively connected. The memory 634 can include one or more non-transitory computer-readable storage media, such as RAM, ROM, EEPROM, EPROM, flash memory devices, magnetic disks, etc., and combinations thereof. The memory 634 can store data 636 and instructions 638 which are executed by the processor 632 to cause the server computing system 630 to perform operations.

In some implementations, the server computing system 630 includes or is otherwise implemented by one or more server computing devices. In instances in which the server computing system 630 includes multiple server computing devices, such server computing devices can operate according to sequential computing architectures, parallel computing architectures, or some combination thereof.

As described above, the server computing system 630 can store or otherwise include one or more machine-learned models 640. For example, the machine-learned models 640 can be or can otherwise include various machine-learned models. Example machine-learned models include neural networks or other multi-layer non-linear models. Example neural networks include feed forward neural networks, deep neural networks, recurrent neural networks, and convolutional neural networks. Some example machine-learned models can leverage an attention mechanism such as self-attention. For example, some example machine-learned models can include multi-headed self-attention models (e.g., transformer models). In some examples, machine-learned models include and use one or more embedding tables (not shown).

The user computing device 602 and/or the server computing system 630 can train the machine-learned model 620 and/or machine-learned model 640, and/or any embedding tables (not shown) associated with machine-learned models 620, 640, via interaction with the training computing system 650 that is communicatively coupled over the network 680. The training computing system 650 can be separate from the server computing system 630 or can be a portion of the server computing system 630.

The training computing system 650 includes one or more processors 652 and a memory 654. The one or more processors 652 can be any suitable processing device (e.g., a processor core, a microprocessor, an ASIC, an FPGA, a controller, a microcontroller, etc.) and can be one processor or a plurality of processors that are operatively connected. The memory 654 can include one or more non-transitory computer-readable storage media, such as RAM, ROM, EEPROM, EPROM, flash memory devices, magnetic disks, etc., and combinations thereof. The memory 654 can store data 656 and instructions 658 which are executed by the processor 652 to cause the training computing system 650 to perform operations. In some implementations, the training computing system 650 includes or is otherwise implemented by one or more server computing devices.

The training computing system 650 can include a model trainer 660 that trains the machine-learned model 620 and/or machine-learned model 640, and/or any embedding tables (not shown) associated with machine-learned models 620,

640, stored at the user computing device 602 and/or the server computing system 630 using various training or learning techniques, such as, for example, backwards propagation of errors. For example, a loss function can be back-propagated through the model(s) to update one or more parameters of the model(s) (e.g., based on a gradient of the loss function). Various loss functions can be used such as mean squared error, likelihood loss, cross entropy loss, hinge loss, and/or various other loss functions. Gradient descent techniques can be used to iteratively update the parameters over a number of training iterations.

In some implementations, performing backwards propagation of errors can include performing truncated back-propagation through time. The model trainer 660 can perform a number of generalization techniques (e.g., weight decays, dropouts, etc.) to improve the generalization capability of the models being trained. Further, the model trainer 660 can train machine-learned model 620 and/or machine-learned model 640, and/or any embedding tables (not shown) associated with machine-learned models 620, 640, based on a set of training data (e.g., training dataset 662).

In some implementations, if the user has provided consent, the training examples can be provided by the user computing device 602. Thus, in such implementations, the machine-learned model 620 provided to the user computing device 602 can be trained by the training computing system 650 on user-specific data received from the user computing device 602. In some instances, this process can be referred to as personalizing the model.

The model trainer 660 includes computer logic utilized to provide desired functionality. The model trainer 660 can be implemented in hardware, firmware, and/or software controlling a processor. For example, in some implementations, the model trainer 660 includes program files stored on a storage device, loaded into a memory and executed by one or more processors. In other implementations, the model trainer 660 includes one or more sets of computer-executable instructions that are stored in a tangible computer-readable storage medium such as RAM, hard disk, or optical or magnetic media.

The network 680 can be any type of communications network, such as a local area network (e.g., intranet), wide area network (e.g., Internet), or some combination thereof and can include any number of wired or wireless links. In general, communication over the network 680 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

The examples provided in the present disclosure may be used in association with machine-learned models used in a variety of tasks, applications, and/or use cases. In addition, such machine-learned models may utilize one or more embedding tables and implement efficient embedding table storage and lookup in accordance with examples of the present disclosure.

In some implementations, the input to the machine-learned model(s) of the present disclosure can be image data. The machine-learned model(s) can process the image data to generate an output. As an example, the machine-learned model(s) can process the image data to generate an image recognition output (e.g., a recognition of the image data, a latent embedding of the image data, an encoded representation of the image data, a hash of the image data, etc.). As another example, the machine-learned model(s) can process the image data to generate an image segmentation output. As another example, the machine-learned model(s) can process the image data to generate an image classification output. As another example, the machine-learned model(s) can process the image data to generate an image data modification output (e.g., an alteration of the image data, etc.). As another example, the machine-learned model(s) can process the image data to generate an encoded image data output (e.g., an encoded and/or compressed representation of the image data, etc.). As another example, the machine-learned model(s) can process the image data to generate an upscaled image data output. As another example, the machine-learned model(s) can process the image data to generate a prediction output.

In some implementations, the input to the machine-learned model(s) of the present disclosure can be text or natural language data. The machine-learned model(s) can process the text or natural language data to generate an output. As an example, the machine-learned model(s) can process the natural language data to generate a language encoding output. As another example, the machine-learned model(s) can process the text or natural language data to generate a latent text embedding output. As another example, the machine-learned model(s) can process the text or natural language data to generate a translation output. As another example, the machine-learned model(s) can process the text or natural language data to generate a classification output. As another example, the machine-learned model(s) can process the text or natural language data to generate a textual segmentation output. As another example, the machine-learned model(s) can process the text or natural language data to generate a semantic intent output. As another example, the machine-learned model(s) can process the text or natural language data to generate an upscaled text or natural language output (e.g., text or natural language data that is higher quality than the input text or natural language, etc.). As another example, the machine-learned model(s) can process the text or natural language data to generate a prediction output.

In some implementations, the input to the machine-learned model(s) of the present disclosure can be speech data. The machine-learned model(s) can process the speech data to generate an output. As an example, the machine-learned model(s) can process the speech data to generate a speech recognition output. As another example, the machine-learned model(s) can process the speech data to generate a speech translation output. As another example, the machine-learned model(s) can process the speech data to generate a latent embedding output. As another example, the machine-learned model(s) can process the speech data to generate an encoded speech output (e.g., an encoded and/or compressed representation of the speech data, etc.). As another example, the machine-learned model(s) can process the speech data to generate an upscaled speech output (e.g., speech data that is higher quality than the input speech data, etc.). As another example, the machine-learned model(s) can process the speech data to generate a textual representation output (e.g., a textual representation of the input speech data, etc.). As another example, the machine-learned model(s) can process the speech data to generate a prediction output.

In some implementations, the input to the machine-learned model(s) of the present disclosure can be latent encoding data (e.g., a latent space representation of an input, etc.). The machine-learned model(s) can process the latent encoding data to generate an output. As an example, the machine-learned model(s) can process the latent encoding data to generate a recognition output. As another example, the machine-learned model(s) can process the latent encoding data to generate a reconstruction output. As another example, the machine-learned model(s) can process the latent encoding data to generate a search output. As another example, the machine-learned model(s) can process the latent encoding data to generate a reclustering output. As another example, the machine-learned model(s) can process the latent encoding data to generate a prediction output.

In some implementations, the input to the machine-learned model(s) of the present disclosure can be statistical data. The machine-learned model(s) can process the statistical data to generate an output. As an example, the machine-learned model(s) can process the statistical data to generate a recognition output. As another example, the machine-learned model(s) can process the statistical data to generate a prediction output. As another example, the machine-learned model(s) can process the statistical data to generate a classification output. As another example, the machine-learned model(s) can process the statistical data to generate a segmentation output. As another example, the machine-learned model(s) can process the statistical data to generate a visualization output. As another example, the machine-learned model(s) can process the statistical data to generate a diagnostic output.

In some implementations, the input to the machine-learned model(s) of the present disclosure can be sensor data. The machine-learned model(s) can process the sensor data to generate an output. As an example, the machine-learned model(s) can process the sensor data to generate a recognition output. As another example, the machine-learned model(s) can process the sensor data to generate a prediction output. As another example, the machine-learned model(s) can process the sensor data to generate a classification output. As another example, the machine-learned model(s) can process the sensor data to generate a segmentation output. As another example, the machine-learned model(s) can process the sensor data to generate a visualization output. As another example, the machine-learned model(s) can process the sensor data to generate a diagnostic output. As another example, the machine-learned model(s) can process the sensor data to generate a detection output.

In some cases, the machine-learned model(s) can be configured to perform a task that includes encoding input data for reliable and/or efficient transmission or storage (and/or corresponding decoding). For example, the task may be an audio compression task. The input may include audio data and the output may comprise compressed audio data. In another example, the input includes visual data (e.g. one or more images and/or videos), the output comprises compressed visual data, and the task is a visual data compression task. In another example, the task may comprise generating an embedding for input data (e.g. input audio or visual data).

In some cases, the input includes visual data and the task is a computer vision task. In some cases, the input includes pixel data for one or more images and the task is an image processing task. For example, the image processing task can be image classification, where the output is a set of scores, each score corresponding to a different object class and representing the likelihood that the one or more images depict an object belonging to the object class. The image processing task may be object detection, where the image processing output identifies one or more regions in the one or more images and, for each region, a likelihood that region depicts an object of interest. As another example, the image processing task can be image segmentation, where the image processing output defines, for each pixel in the one or more images, a respective likelihood for each category in a predetermined set of categories. For example, the set of categories can be foreground and background. As another example, the set of categories can be object classes. As another example, the image processing task can be depth estimation, where the image processing output defines, for each pixel in the one or more images, a respective depth value. As another example, the image processing task can be motion estimation, where the network input includes multiple images, and the image processing output defines, for each pixel of one of the input images, a motion of the scene depicted at the pixel between the images in the network input.

In some cases, the input includes audio data representing a spoken utterance and the task is a speech recognition task. The output may comprise a text output which is mapped to the spoken utterance. In some cases, the task comprises encrypting or decrypting input data. In some cases, the task comprises a microprocessor performance task, such as branch prediction or memory address translation.

FIG. 6A illustrates one example computing system that can be used to implement the present disclosure. Other computing systems can be used as well. For example, in some implementations, the user computing device 602 can include the model trainer 660 and the training dataset 662. In such implementations, the machine-learned model 620 can be both trained and used locally at the user computing device 602. In some of such implementations, the user computing device 602 can implement the model trainer 660 to personalize the machine-learned model 620 based on user-specific data.

Figure 6B:
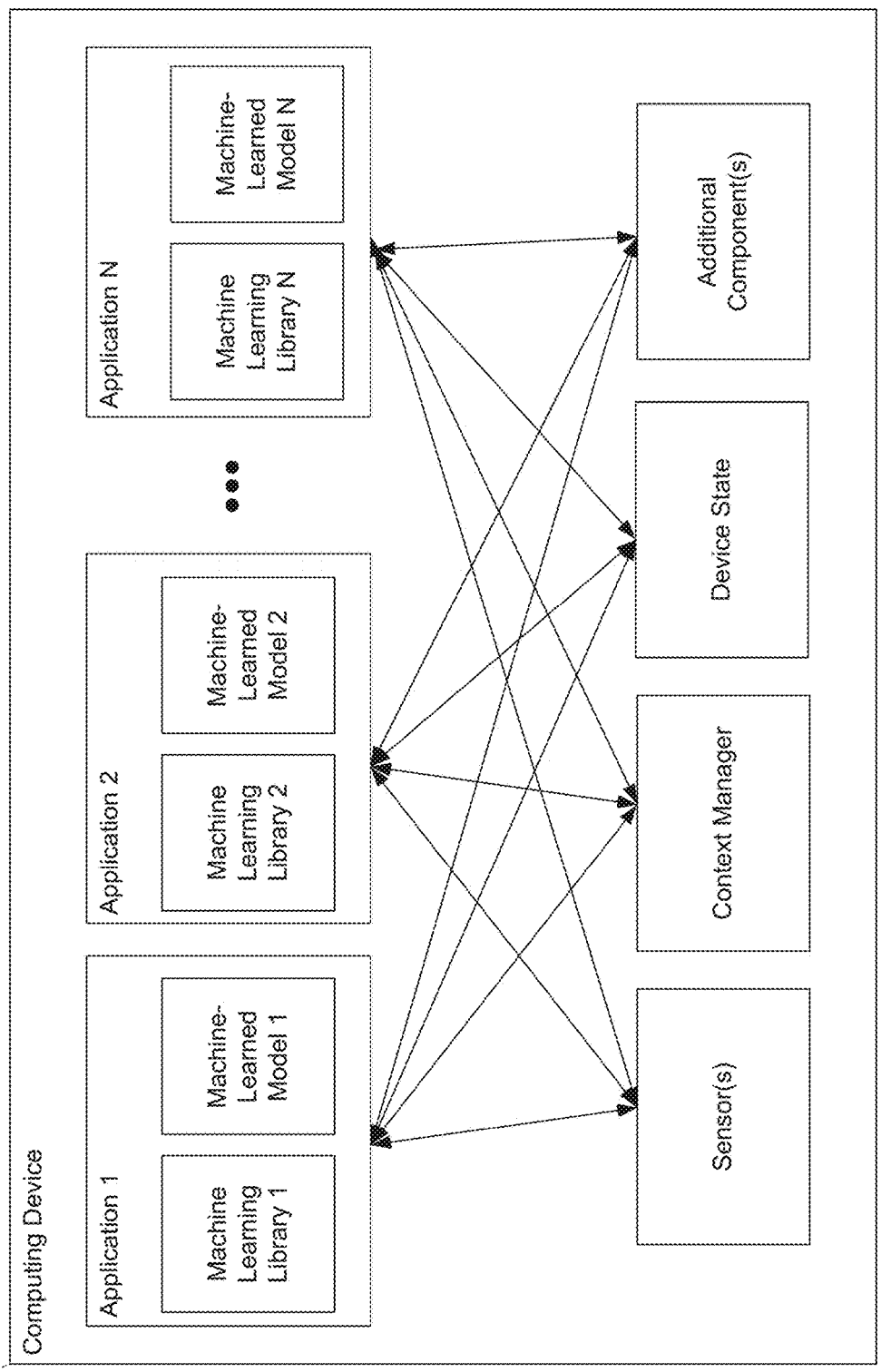
FIG. 6B depicts a block diagram of an example computing device that performs efficient embedding table storage and lookup according to example embodiments of the present disclosure.

FIG. 6B depicts a block diagram of an example computing device 682 that performs operations according to example embodiments of the present disclosure. The computing device 682 can be a user computing device or a server computing device.

The computing device 682 includes a number of applications (e.g., applications 1 through N). Each application contains its own machine learning library and machine-learned model(s). For example, each application can include a machine-learned model, which may include and use one or more embedding tables. Example applications include a text messaging application, an email application, a dictation application, a virtual keyboard application, a browser application, etc.

As illustrated in FIG. 6B, each application can communicate with a number of other components of the computing device, such as, for example, one or more sensors, a context manager, a device state component, and/or additional components. In some implementations, each application can communicate with each device component using an application programming interface (API) (e.g., a public API). In some implementations, the API used by each application is specific to that application.

Figure 6C:
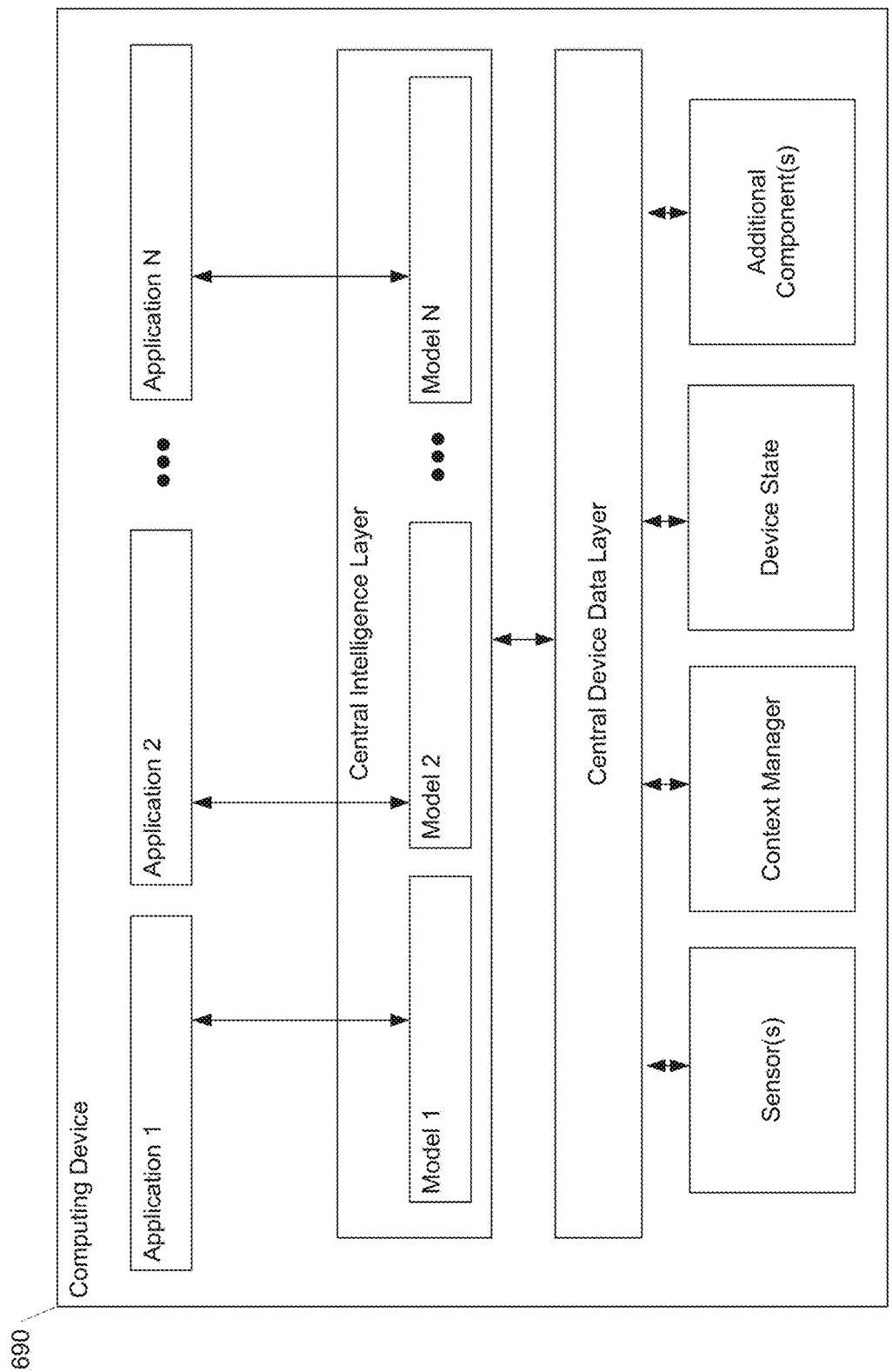
FIG. 6C depicts a block diagram of an example computing device that performs efficient embedding table storage and lookup according to example embodiments of the present disclosure.

FIG. 6C depicts a block diagram of an example computing device 690 that performs according to example embodiments of the present disclosure. The computing device 690 can be a user computing device or a server computing device.

The computing device 690 includes a number of applications (e.g., applications 1 through N). Each application is in communication with a central intelligence layer. Example applications include a text messaging application, an email application, a dictation application, a virtual keyboard application, a browser application, etc. In some implementations, each application can communicate with the central intelligence layer (and model(s) stored therein) using an API (e.g., a common API across all applications).

The central intelligence layer includes a number of machine-learned models. For example, as illustrated in FIG. 6C, a respective machine-learned model can be provided for each application and managed by the central intelligence layer. In other implementations, two or more applications can share a single machine-learned model. For example, in some implementations, the central intelligence layer can provide a single model for all of the applications. In some implementations, the central intelligence layer is included within or otherwise implemented by an operating system of the computing device 690.

The central intelligence layer can communicate with a central device data layer. The central device data layer can be a centralized repository of data for the computing device 690. As illustrated in FIG. 6C, the central device data layer can communicate with a number of other components of the computing device, such as, for example, one or more sensors, a context manager, a device state component, and/or additional components. In some implementations, the central device data layer can communicate with each device component using an API (e.g., a private API).

ADDITIONAL DISCLOSURE

The technology discussed herein makes reference to servers, databases, software applications, and other computer-based systems, as well as actions taken, and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A computer-implemented method for performing efficient embedding table storage and lookup in machine-learning models, comprising:

obtain, by one or more processors, an embedding table associated with a machine-learning model, the embedding table comprising a plurality of embeddings respectively associated with a corresponding index of the embedding table;

compressing, by the one or more processors, each particular embedding of the embedding table individually allowing each respective embedding of the embedding table to be decompressed independent of any other embedding in the embedding table; and packing, by the one or more processors, the embedding table comprising individually compressed embeddings with the machine-learning model.

2. The computer-implemented method of claim 1, further comprising:

updating, by the one or more processors, respective indexes of the embedding table based on a hashing operation.

3. The computer-implemented method of claim 1, further comprising:

providing, by the one or more processors, the embedding table comprising individually compressed rows packed with the machine-learning model to one or more computing devices.

4. The computer-implemented method of claim 1, wherein the compressing is performed independent from a machine-learning platform.

5. The computer-implemented method of claim 1, wherein the compressing is performed using compression unavailable from a machine-learning platform.

6. The computer-implemented method of claim 1, wherein respective embeddings in the embedding table are associated with an item from a plurality of items included in a vocabulary.

7. The computer-implemented method of claim 1, wherein the machine-learning model is associated with an embedding layer of a neural network.

* * * * *